(12) United States Patent
Youssefi

(10) Patent No.: US 10,417,460 B1
(45) Date of Patent: Sep. 17, 2019

(54) LOW POWER ANALOG VECTOR-MATRIX MULTIPLIER

(71) Applicant: Behdad Youssefi, Berkeley, CA (US)

(72) Inventor: Behdad Youssefi, Berkeley, CA (US)

(73) Assignee: AREANNA INC., Berkeley, CA (US)

( * ) Notice: Subject to any disclaimer, the term of this patent is extended or adjusted under 35 U.S.C. 154(b) by 0 days.

(21) Appl. No.: 16/141,817

(22) Filed: Sep. 25, 2018

Related U.S. Application Data

(60) Provisional application No. 62/562,493, filed on Sep. 25, 2017.

(51) Int. Cl.
| | |
|---|---|
| *H03M 1/38* | (2006.01) |
| *G06G 7/32* | (2006.01) |
| *G06G 7/16* | (2006.01) |
| *H03M 1/10* | (2006.01) |
| *H03M 1/00* | (2006.01) |
| *H03M 1/06* | (2006.01) |
| *H03M 1/12* | (2006.01) |

(52) U.S. Cl.
CPC ............. *G06G 7/32* (2013.01); *G06G 7/16* (2013.01); *H03M 1/38* (2013.01); *H03M 1/00* (2013.01); *H03M 1/06* (2013.01); *H03M 1/10* (2013.01); *H03M 1/12* (2013.01)

(58) Field of Classification Search
CPC ............ H03M 1/00; H03M 1/12; H03M 1/06; H03M 1/10
USPC .................................. 341/161, 155, 110, 118
See application file for complete search history.

(56) References Cited

U.S. PATENT DOCUMENTS

2014/0015699 A1* 1/2014 Zhao .................. H03M 1/0604 341/110

* cited by examiner

*Primary Examiner* — Joseph J Lauture
(74) *Attorney, Agent, or Firm* — Alston & Bird LLP

(57) ABSTRACT

Methods and apparatuses enable a general-purpose low power analog vector-matrix multiplier. This Abstract is not intended to limit the scope of the claims.

14 Claims, 7 Drawing Sheets

LOW POWER ANALOG VECTOR-MATRIX MULTIPLIER

CROSS REFERENCE TO RELATED APPLICATIONS

The present application claims the benefit of priority to U.S. Provisional Patent Application No. 62/562,493, titled "ANALOG MATRIX MULTIPLIER," filed Sep. 25, 2017, the contents of which are incorporated herein by reference in their entirety.

BACKGROUND

Matrix multiplication or matrix product is a binary operation that produces a matrix from two matrices with entries in a field, or, more generally, in a ring or even a semi-ring. The matrix product is designed for representing the composition of linear maps that are represented by matrices. Matrix multiplication is thus a basic tool of linear algebra, and as such has numerous applications in many areas of mathematics, as well as in applied mathematics, statistics, physics, economics, and engineering. In more detail, if A is an n×m matrix and B is an m×p matrix, their matrix product AB is an n×p matrix, in which the m entries across a row of A are multiplied with the m entries down a column of B and summed to produce an entry of AB. When two linear maps are represented by matrices, then the matrix product represents the composition of the two maps.

Computing matrix products is a central operation in all computational applications of linear algebra. Its computational complexity is $O(n^3)$ (for n×n matrices) for the basic algorithm (this complexity is $O(n^{2.373})$ for the asymptotically fastest known algorithm). This nonlinear complexity means that matrix product is often the critical part of many algorithms. This is enforced by the fact that many operations on matrices, such as matrix inversion, determinant, solving systems of linear equations, have the same complexity. Therefore various algorithms have been devised for computing products of large matrices, taking into account the architecture of computers.

Matrix multiplication is at the heart of all machine learning algorithms and is the most computationally expensive task in these applications. Most machine learning implementations use general-purpose CPUs and perform matrix multiplications in serial fashion. The serial computations in the digital domain together with limited memory bandwidth sets a limit on maximum throughput and power efficiency of the computing system.

SUMMARY

Embodiments of the present disclosure are related to an analog matrix multiplier. In embodiments, the analog matrix multiplier comprises a plurality of successive approximation registers (SAR). In embodiments, each successive approximation register (SAR) has a successive approximation register (SAR) digital output. In embodiments, the plurality of successive approximation registers (SAR) operate in parallel and a plurality of scaling and recombining circuits for scaling and recombining each SAR's digital output, each successive approximation register's (SAR) digital output resulting from quantization of a bit-wise multiplication of a digital weight matrix with an input analog voltage vector. In embodiments, each scaling and recombining circuit is connected in series to a successive approximation register (SAR) of the plurality of successive approximation registers (SAR).

In embodiments, the analog matrix multiplier further comprises a plurality of charge transfer circuits. In embodiments, each charge transfer circuit connected in series to a successive approximation register (SAR) of the plurality of successive approximation registers (SAR).

In embodiments, a successive approximation register (SAR) comprises a plurality of successive approximation register (SAR) circuits connected in parallel, a comparator, and a state machine.

In embodiments, a successive approximation register (SAR) circuit comprises a first switch, a second switch, and a third switch, where the first switch and the second switch are complementary, and a successive approximation circuit (SAR) capacitor.

In embodiments, the third switch is open in a sampling operation of the analog matrix multiplier and closed in a quantization operation of the analog matrix multiplier.

In embodiments, when a bit-wise weight value is high, the first switch is closed and the second switch is open, and when a bit-wise weight value is low, the first switch is open and the second switch is closed.

In embodiments, the comparator compares a reference voltage Vref to an output voltage of the plurality of SAR circuits. In embodiments, an output of the comparator is an input to the state machine.

In embodiments, the successive approximation register (SAR) further comprises a reset switch that is closed in a sampling operation of the analog matrix multiplier and open in a quantization operation of the analog matrix multiplier.

In embodiments, a scaling and recombining circuit comprises a delay element, a sampling switch, an adder, and a divider.

In embodiments, a charge transfer circuit comprises an operational amplifier and a charge transfer circuit capacitor. In embodiments, the charge transfer circuit transfers a charge from a first stage to a second stage.

In embodiments, the bit-wise multiplication of a digital weight matrix with an input analog voltage vector is performed by the successive approximation registers (SAR) using only the successive approximation register (SAR) capacitors.

In embodiments, the successive approximation register (SAR) further comprises a successive approximation register (SAR) local memory. In embodiments, the successive approximation register (SAR) local memory is configured to store bit-wise weight values.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

BRIEF DESCRIPTION OF THE DRAWINGS

The following Detailed Description, Figures, appended Additional Figures and appended Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale, and are part of the Disclosure.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

Figure 1:
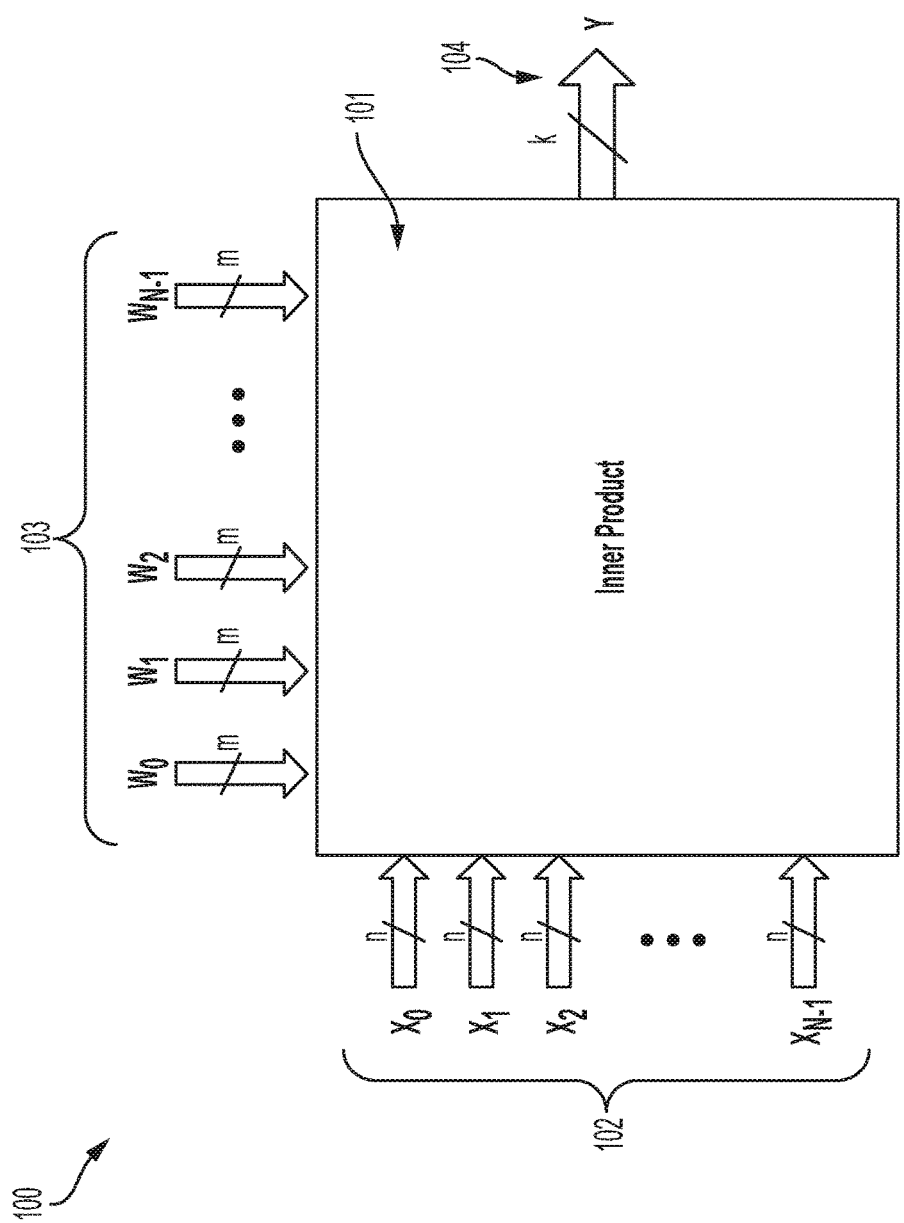
FIG. 1 illustrates a top-level diagram of an exemplary analog vector-vector inner multiplier.

In such various figures, reference signs may be omitted as is consistent with accepted engineering practice; however, one of ordinary skill in the art will understand that the illustrated components are readily understood when viewed in context of the illustration as a whole and the accompanying disclosure describing such various figures.

DETAILED DESCRIPTION

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

A general-purpose low power analog Vector-Matrix Multiplier (VMM) is presented. The vector-matrix multiplier computes N inner products of n-dimensional inputs with m-dimensional weights in parallel. A significant power efficiency is achieved by performing multiply-and-accumulate in analog domain and storing weight values locally so that power hungry data communication between memory and computational unit is eliminated $$Y_{1 \times N}^{(n)} = X_{1 \times N}^{(n)} \cdot W_{N \times N}^{(m)} \qquad (1)$$

An analog implementation provides a natural medium to implement fully parallel computational arrays with high integration density and energy efficiency. By summing charges on each capacitor in a large capacitor bank, an analog vector-matrix multiplier can accomplish a massively parallel multiply-and-accumulate (MAC) with low latency.

The analog vector-matrix multiplier is comprised of one Successive Approximation Register (SAR) Analog to Digital Converter (ADC) per input. The capacitor bank of each SAR is not binary weighted and is expanded to provide one connection per input. Inputs are provided as analog voltages and weights are implemented digitally in bit-serial fashion. SAR architecture provides a low power solution that inherently contains both a DAC and an ADC. The ADC quantizes the result of each MAC operation which can be stored locally while DAC converts the digital output back into analog domain, so it can be used as an input to the next stage. This process makes this architecture highly scalable and can be cascaded many times to implement a very large neural network. Carrying out quantization by a SAR ADC has an added advantage of dynamically lowering the resolution of the results for applications that require faster and more power efficient but less precise computations. An N×N matrix multiplier can be constructed by an array of N analog vector-vector inner multiplier each with N inputs and a log 2(N) bit resolution SAR. The distributed nature of local storage of the results absolves the need for high bandwidth memory which significantly increases the power efficiency of the system. Moreover, storing the results digitally allows for reconfigurable digital post-processing and can be used to apply non-linearity.

FIG. 1 illustrates a top-level diagram of an exemplary analog vector-vector inner multiplier 100. In FIG. 1, multiplier 100 computes N inner products 101 of n-bit inputs $(X_0 \ldots X_{N-1})$ 102 with m-bit weights $(W_0 \ldots W_{N-1})$ 103 in parallel. Multiplier 100 produces one k-bit output (Y) 104.

Figure 2:
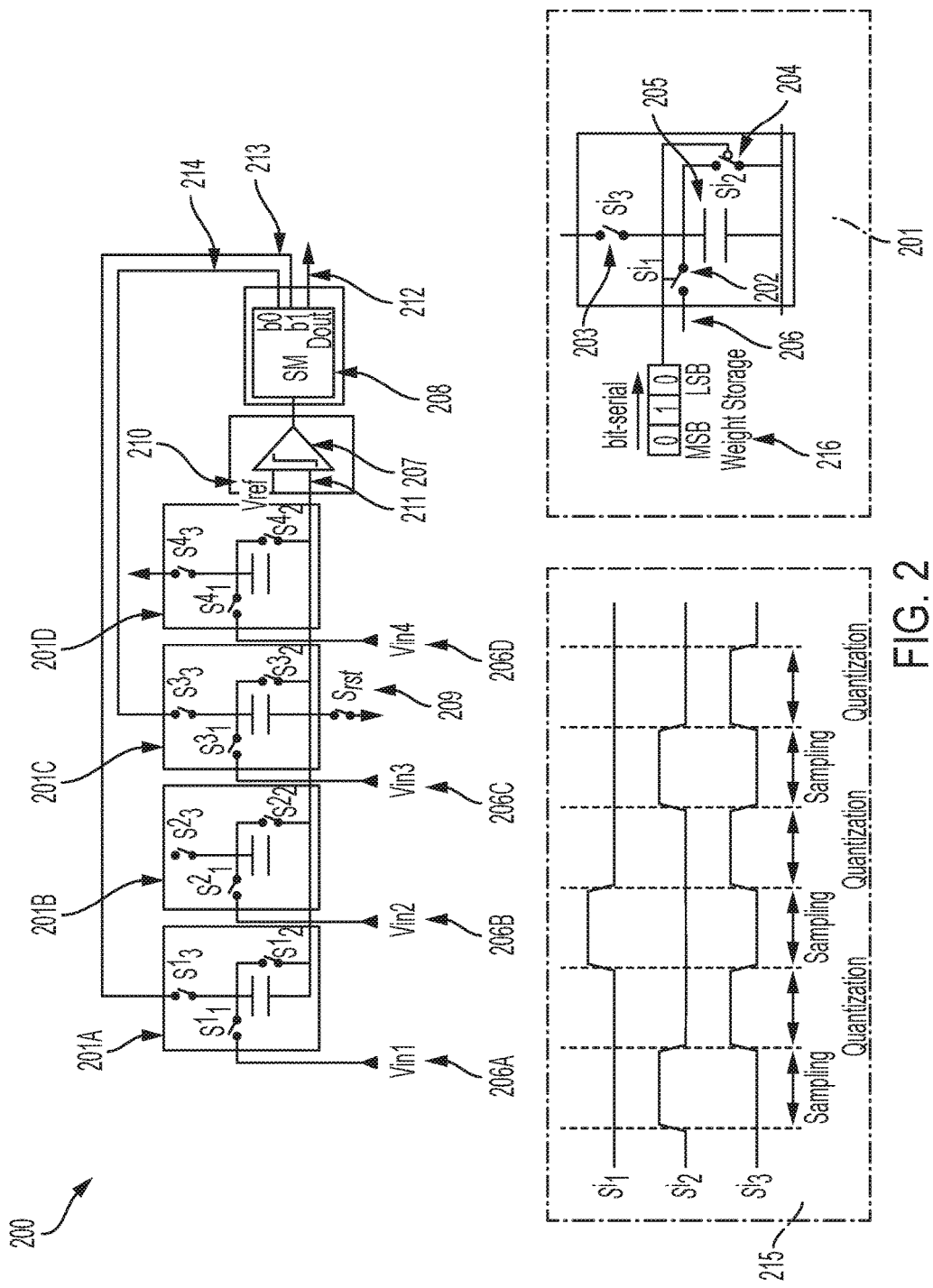
FIG. 2 illustrates an exemplary implementation of an exemplary successive approximation register (SAR) for use with embodiments of the present disclosure.

FIG. 2 illustrates an exemplary implementation of an exemplary successive approximation register (SAR) 200 for use with embodiments of the present disclosure. An exemplary SAR comprises a plurality of (e.g., four (4) in FIG. 2) SAR circuits 201A-201D connected in parallel. Each of SAR circuits 201A-201D (shown in blown up 201 in FIG. 2) comprises three switches $S_1^i$ 202, $S_2^i$ 204 and $S_3^i$ 203, and a capacitor 205 and successive approximation register (SAR) local memory 216 for storing weight values. Switches $S_1^i$ 202 and $S_2^i$ 204 are complementary and based on bit-wise weight value stored in successive approximation register (SAR) local memory 216, for the corresponding input 206 (e.g., one of Vin1-Vin4 206A-206D in FIG. 2). When bit-wise weight value is high, switch $S_1^i$ 202 is closed and switch $S_2^i$ 204 is open and vice versa. To be clear, when bit-wise weight value is low, switch $S_1^i$ 202 is open and switch $S_2^i$ 204 is closed. Switch $S_3^i$ 203 is open in the sampling stage and closed in normal SAR quantization operation. The timing diagram 215 illustrates the orientation of the switches $S_1^i$, $S_2^i$ and $S_3^i$ with the exemplary 3-bit weight stored in successive approximation register (SAR) local memory 216 in sampling and quantization stages.

In embodiments, SAR 200 further comprises a comparator 207 and a state machine 208. Comparator 207 compares a reference voltage Vref 210 to an output voltage 211 of the SAR circuits 201A-201D to provide an input for the state machine SM 208. State machine SM 208 provides an output b0 214 that is fed back to a SAR circuit 201C, an output b1 213 that is fed back to SAR circuits 201A and 201B, and an output Dout 212.

In embodiments, SAR 200 further comprises a reset switch $S_{rst}$ 209 that is closed in the sampling stage and open in quantization stage.

Figure 3:
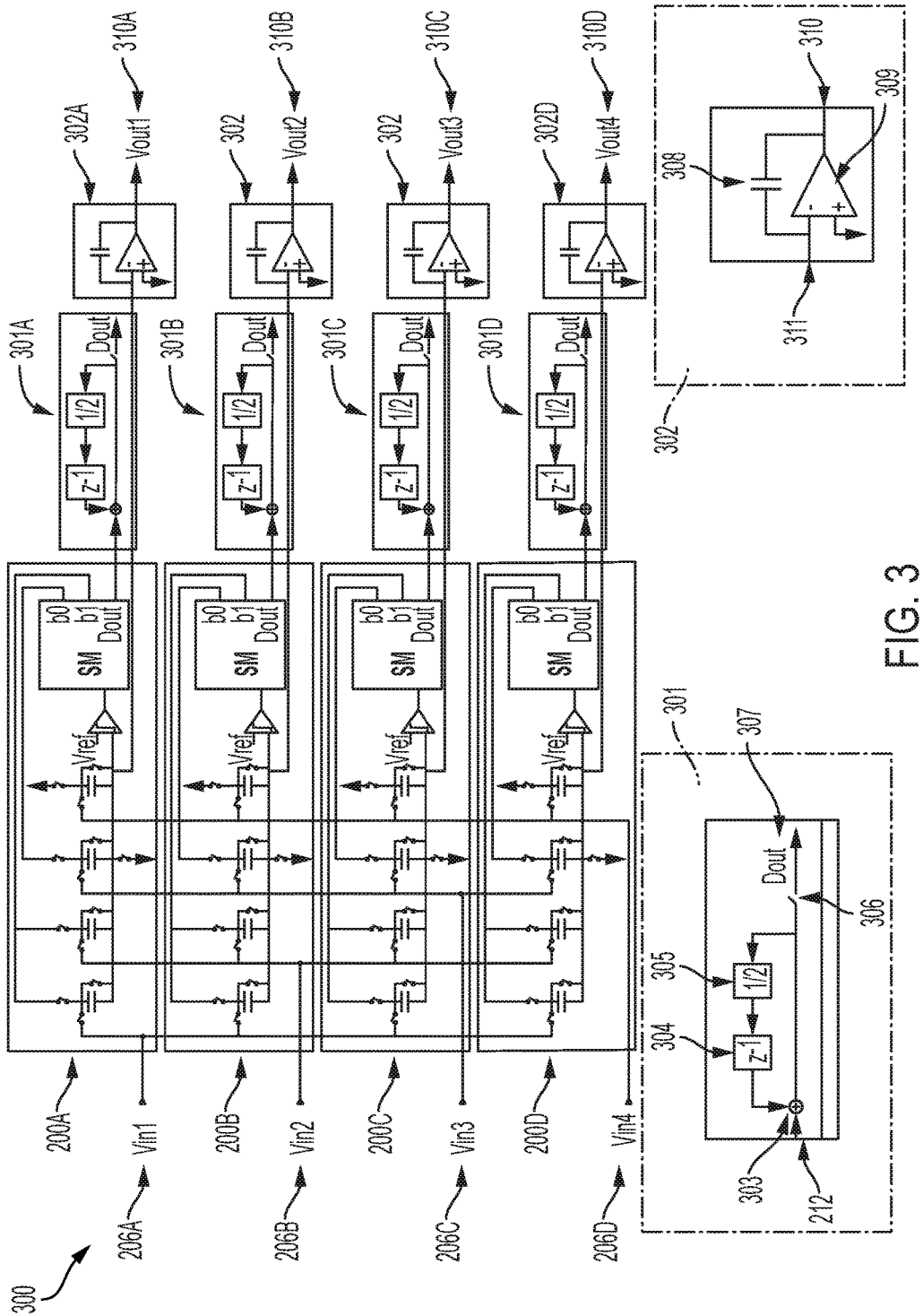
FIG. 3 illustrates a 2-bit implementation of an exemplary analog matrix multiplier, in accordance with embodiments of the present disclosure.

FIG. 3 illustrates a 2-bit implementation of an exemplary analog matrix multiplier 300 in accordance with embodiments of the present disclosure. In embodiments, analog matrix multiplier 300 comprises a plurality of SARs 200A-200D (e.g., four (4) in FIG. 3) as described with respect to and depicted in FIG. 2.

In embodiments, analog matrix multiplier 300 further comprises a plurality of (e.g., four (4) in FIG. 3) scaling and recombining circuits 301A-301D. Each of scaling and recombining circuits 301A-301D (shown in blown up 301 in FIG. 3) comprises a delay element 304, a sampling switch 306, an adder 303 and a divider 305. Each of scaling and recombining circuits 301 scales and recombines the quantized digital outputs 212 of state machine 208 of bit-wise multiplication of a weight matrix with the input vector 206A-206D according to Equation (2) herein.

In embodiments, analog matrix multiplier 300 further comprises a plurality of (e.g., four (4) in FIG. 3) charge transfer circuits 302A-302D. Each of charge transfer circuits 302A-302D (shown in blown up 302 in FIG. 3) comprises an operational amplifier 309 and a capacitor 308. They are used to transfer charge from one stage to another. That is, charge transfer circuit 302 transfers a received charge 311 to an output 310 (e.g., Vout1 310A-Vout4 310D).

Figure 4:
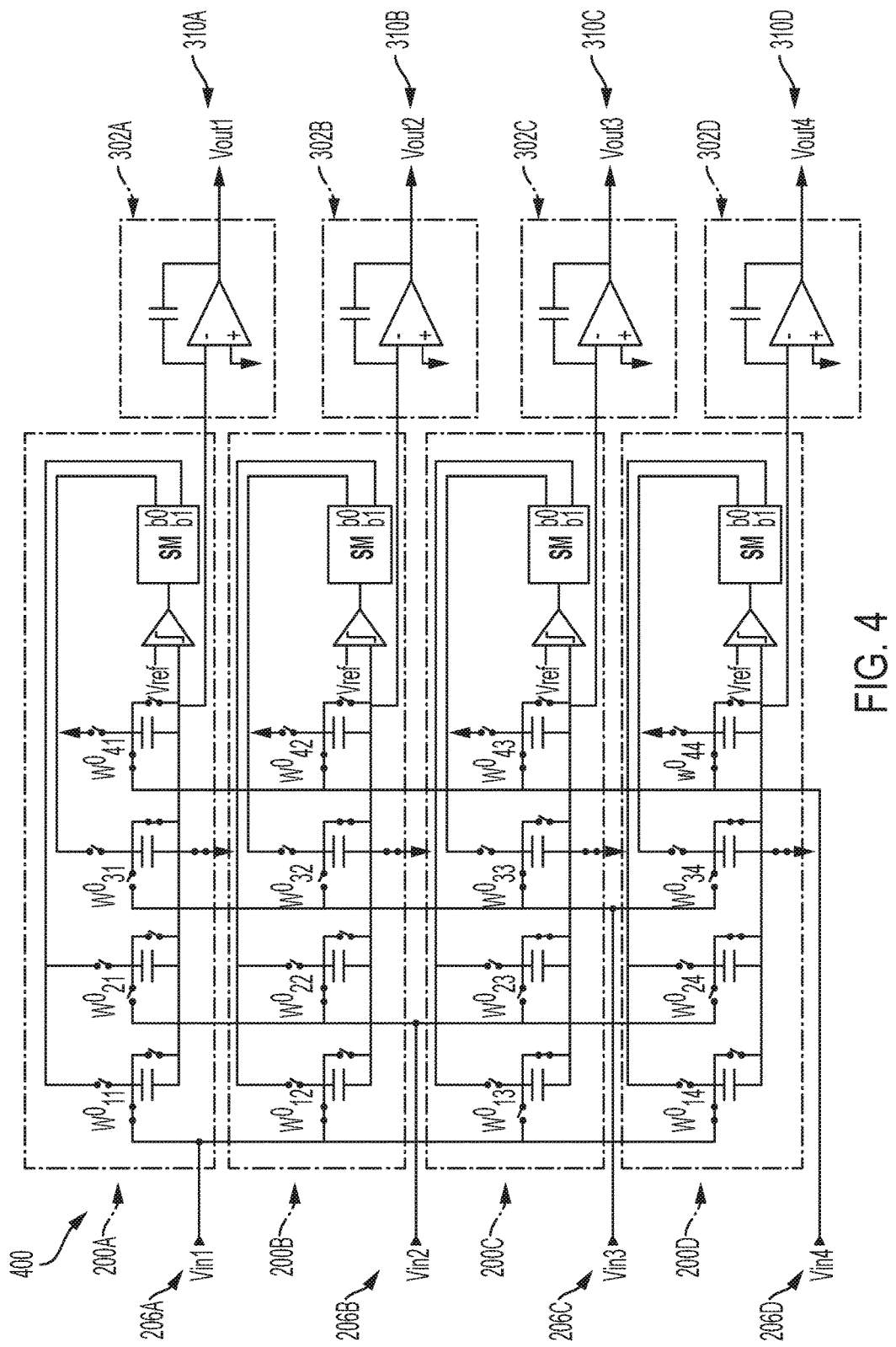
FIG. 4 illustrates an exemplary orientation of switches according to bit-0 of the weight matrix in Equation (3) of an exemplary 2-bit analog matrix multiplier according to embodiments of the present disclosure.

FIG. 4 illustrates an exemplary orientation of switches of an exemplary analog matrix multiplier 400 according to embodiments of the present disclosure. FIG. 4 illustrates an orientation of switches in a multiplication operation of input voltages 206A-206D by bit-0 of a weight matrix according to Equation (3). FIG. 4 illustrates an operation of switches in a multiplication operation using an exemplary implementation 300 illustrated in FIG. 3.

In FIG. 4, the following switches are depicted as open: $w^0_{21}$, $w^0_{31}$, $w^0_{32}$, $w^0_{13}$, $w^0_{23}$, $w^0_{24}$, $w^0_{34}$.

In FIG. 4, the following switches are depicted as closed: $w^0_{11}$, $w^0_{41}$, $w^0_{12}$, $w^0_{22}$, $w^0_{42}$, $w^0_{33}$, $w^0_{43}$, $w^0_{14}$, $w^0_{44}$.

Figure 5:
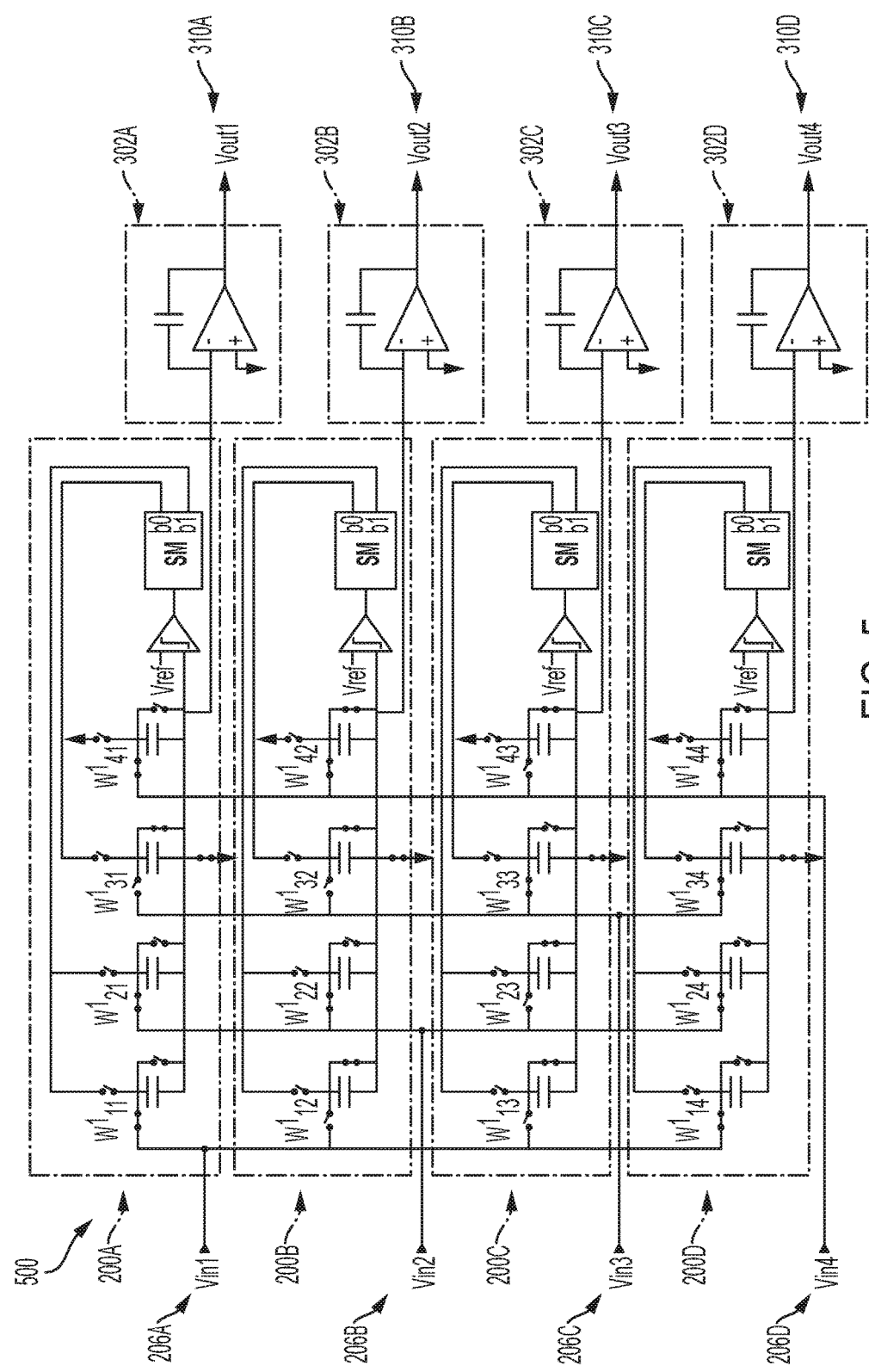
FIG. 5 illustrates an exemplary orientation of switches according to bit-1 of the weight matrix in Equation (3) of an exemplary 2-bit analog matrix multiplier according to embodiments of the present disclosure.

FIG. 5 illustrates an exemplary orientation of switches of an exemplary analog matrix multiplier 500 according to embodiments of the present disclosure. FIG. 5 illustrates an orientation of switches in a multiplication operation of input voltages 206A-206D by bit-1 of a weight matrix according to Equation (3). FIG. 5 illustrates an operation of switches in a multiplication operation using an exemplary implementation 300 illustrated in FIG. 3.

In FIG. 5, the following switches are depicted as open: $w^1_{31}$, $w^1_{12}$, $w^1_{32}$, $w^1_{42}$, $w^1_{13}$, $w^1_{23}$, $w^1_{43}$.

In FIG. 5, the following switches are depicted as closed: $w^1_{11}$, $w^1_{21}$, $w^1_{41}$, $w^1_{22}$, $w^1_{33}$, $w^1_{14}$, $w^1_{24}$, $w^1_{34}$, $w^1_{44}$.

Figure 6:
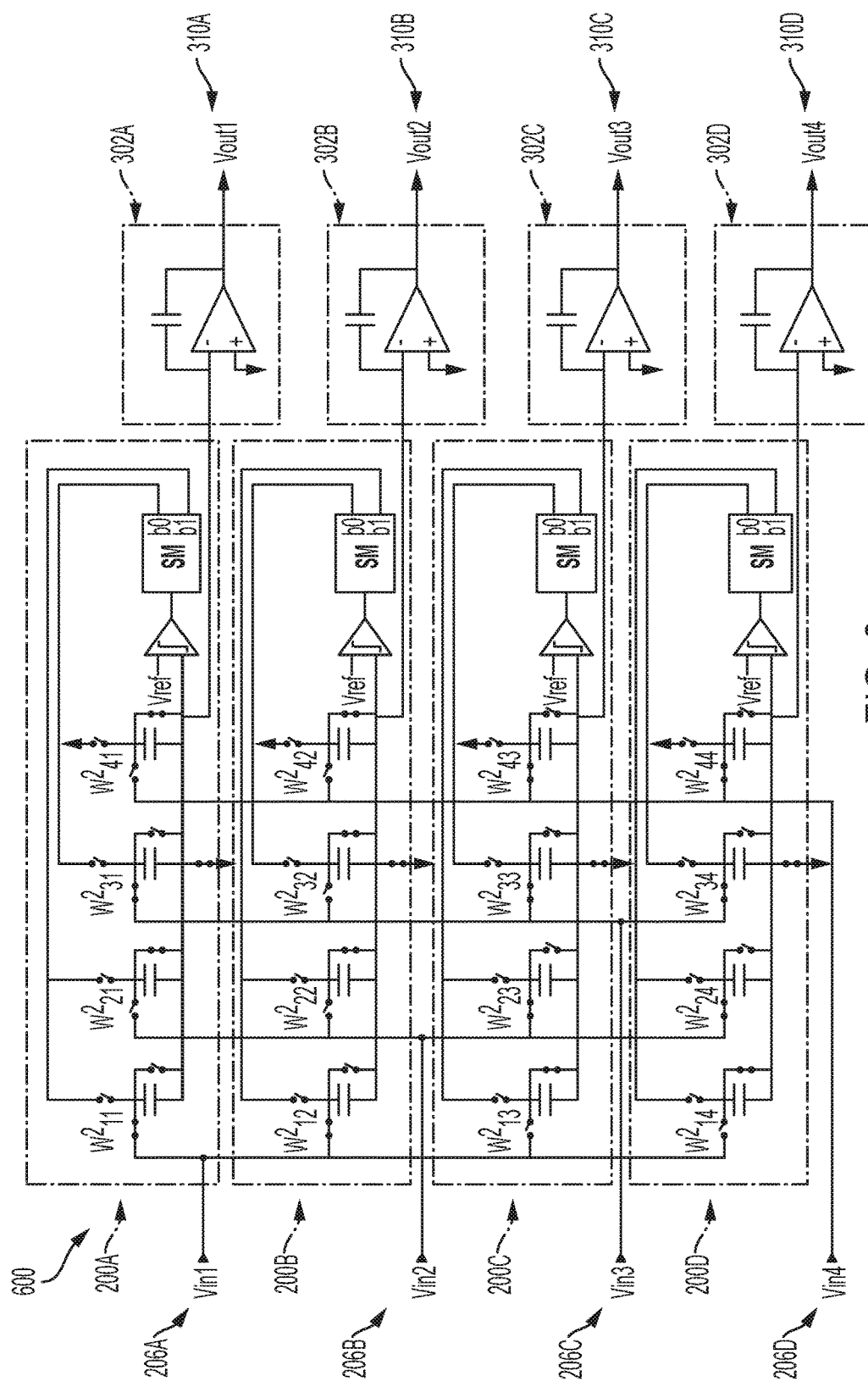
FIG. 6 illustrates an exemplary orientation of switches according to bit-2 of the weight matrix in Equation (3) of an exemplary 2-bit analog matrix multiplier according to embodiments of the present disclosure.

FIG. 6 illustrates an exemplary orientation of switches of an exemplary analog matrix multiplier 600 according to embodiments of the present disclosure. FIG. 6 illustrates an orientation of switches in a multiplication operation of input voltages 206A-206D by bit-2 of a weight matrix according to Equation (3). FIG. 6 illustrates an operation of switches in a multiplication operation using an exemplary implementation 300 illustrated in FIG. 3.

In FIG. 6, the following switches are depicted as open: $w^2_{21}$, $w^2_{41}$, $w^2_{22}$, $w^2_{32}$, $w^2_{42}$, $w^2_{13}$, $w^2_{14}$.

In FIG. 6, the following switches are depicted as closed: $w^2_{11}$, $w^2_{31}$, $w^2_{12}$, $w^2_{23}$, $w^2_{33}$, $w^2_{43}$, $w^2_{24}$, $w^2_{34}$, $w^2_{44}$.

It will be appreciated that, for the sake of space saving in the Figures, scaling and recombining circuits 301 are not shown in the exemplary analog matrix multipliers in FIGS. 4-6, though they are present in the implementation as described herein.

Figure 7:
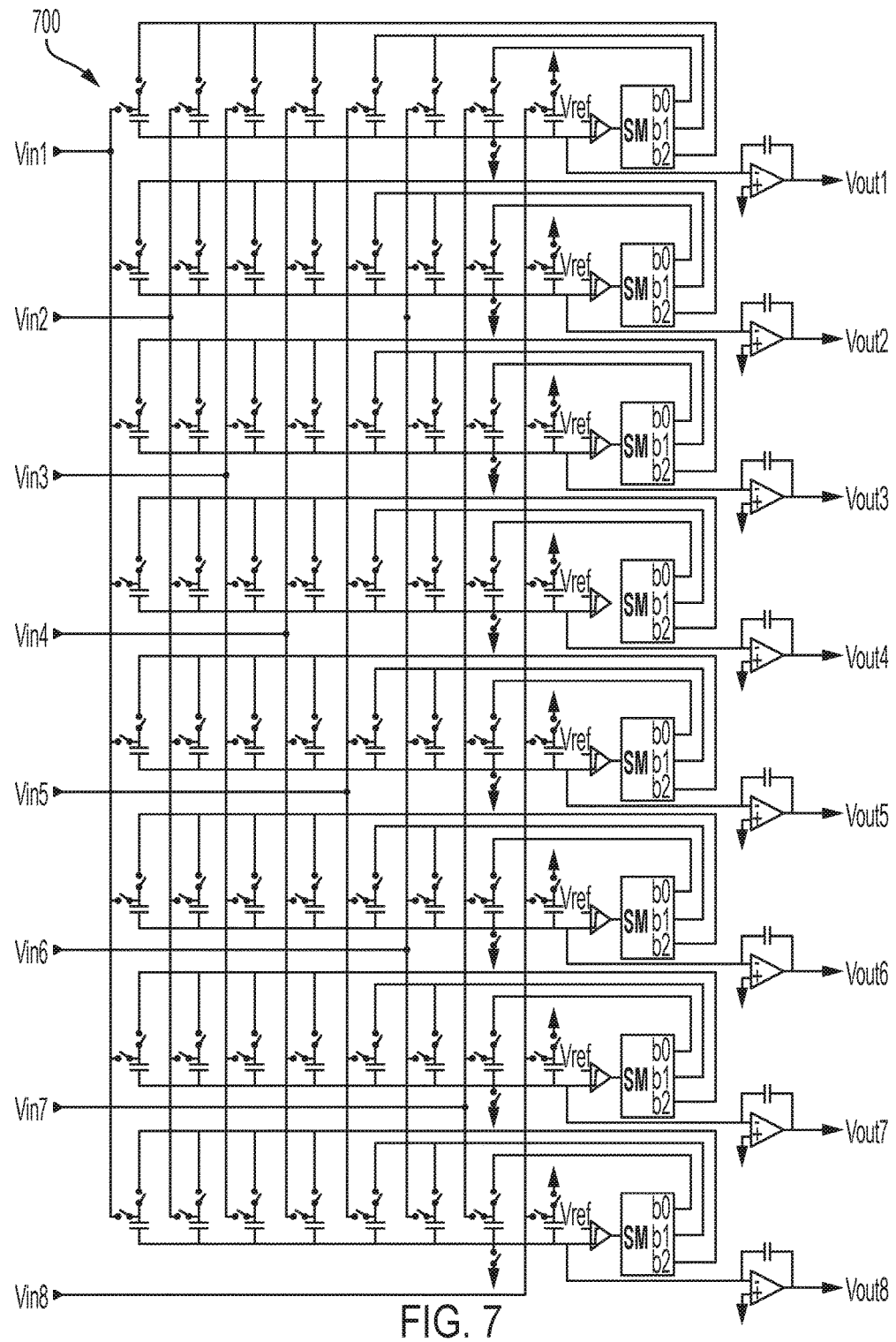
FIG. 7 illustrates an exemplary 3-bit implementation of an exemplary analog matrix multiplier according to embodiments of the present disclosure.

FIG. 7 illustrates an exemplary 3-bit implementation of an exemplary analog matrix multiplier 700 according to embodiments of the present disclosure. It will be appreciated that, for the sake of space saving in the Figure, scaling and recombining circuits 301 are not shown in the exemplary analog matrix multipliers in FIG. 7, though they are present in the implementation as described herein.

It will be appreciated that "weight" and "bit-wise" weight are used herein interchangeably.

Exemplary Sampling and Quantization Operation

In a sampling stage or operation of the exemplary analog vector matrix multiplier, each capacitor (e.g., 205 in FIG. 2) within each SAR (e.g., 200 in FIG. 2) samples one input voltage (e.g., 206A-206D in FIG. 2) or is reset depending on the binary value of the corresponding weight. The shared node of the capacitor bank (e.g., 211 in FIG. 2) in each SAR (e.g., 200 in FIG. 2) is tied to ground through reset switch $S_{rst}$ (e.g., 209 in FIG. 2) while $S_3^i$ (e.g., 203 in FIG. 2) are open. After sampling is done, sampling switches $S_1^i$ (e.g., 202 in FIG. 2) and $S_2^i$ (e.g., 204 in FIG. 2) are open and the SAR (e.g., 200 in FIG. 2) starts the quantization process.

In a quantization stage/operation/process of the exemplary analog vector matrix multiplier, the $S_3^i$ switches (e.g., 203 in FIG. 2) are closed and $S_{rst}$ (e.g., 209 in FIG. 2) is open and the SAR's state machine (e.g., 208 in FIG. 2) sets the top plates of capacitors (e.g., 205 in FIG. 2) in the SAR circuits (e.g., 201A-201D in FIG. 2) according to the output of the comparator (e.g., 207 in FIG. 2). This process happens as many times as there are bits in each element of a weight matrix (bit-serially). The outputs are then binary weighted and combined in the digital domain according to the following equation:

$$D_{out} = \sum_{i=0}^{m-1} 2^{-(m-i)} D_{out_i} \qquad (2)$$

where m is dimension of elements in the weight matrix and $D_{out_i}$ is digital output (e.g., 212 in FIG. 2) of the SAR (e.g., 200 in FIG. 2) for the i-th bit of the corresponding weight. The weighting and combining operation is carried out by scaling and recombining circuits (e.g., 301A-301D in FIG. 3). Digital output $D_{out}$ (e.g., 307 in FIG. 3) is then applied to SAR circuits (200A-200D in FIG. 3) to inject charge on the shared node of the capacitor bank (e.g., 211 in FIG. 2). The charge transfer circuit (e.g., 302 in FIG. 3) is then used to re-generate the output analog voltages (e.g., 310A-310D in FIG. 3) to be used as input to the next stage.

Exemplary 2-Bit Implementation of an Exemplary Analog Matrix Multiplier

In the example described herein, a sampling and quantization process in a 2-bit analog matrix multiplier with 3-bit weights is depicted to illustrate exemplary operation of the exemplary analog matrix multiplier according to embodiments of the present disclosure.

In the present example, a four-input vector is multiplied by the following 4×4 weight matrix:

$$W = \begin{bmatrix} 111'b & 101'b & 000'b & 011'b \\ 010'b & 011'b & 100'b & 110'b \\ 100'b & 000'b & 111'b & 110'b \\ 011'b & 001'b & 101'b & 111'b \end{bmatrix} \quad (3)$$

In this example, N=4, n=2, and m=3 as they are used in Equation (1). Sampling starts with multiplying the inputs by the LSB of the weight matrix, as shown in FIG. 4. In FIG. 4, $W_{ij}^n$ represents the n-th bit of the i-th row and j-th column of the weight matrix.

After sampling, each SAR (e.g., 200A-200D) starts the quantization process as described above. Following complete the SAR quantization process, outputs stored in the state machine (e.g., 208) are as follows:

$$V_{out1} = V_{in1} + V_{in4} \quad (4)$$

$$V_{out2} = V_{in1} + V_{in2} + V_{in4} \quad (5)$$

$$V_{out3} = V_{in3} + V_{in4} \quad (6)$$

$$V_{out4} = V_{in1} + V_{in4} \quad (7)$$

Continuing in this example, the next step involves again sampling the input voltages onto SAR capacitors (e.g., 205) per bit-1 of the weight matrix. At the end of the SAR quantization process, the previous output values stored in the state machine (e.g., 208) are scaled and added to new quantized values as follows:

$$V_{out1} = V_{in1} + V_{in2} + V_{in4} + \frac{1}{2}V_{in1} + \frac{1}{2}V_{in4} \quad (8)$$

$$V_{out2} = V_{in2} + \frac{1}{2}V_{in1} + \frac{1}{2}V_{in2} + \frac{1}{2}V_{in4} \quad (9)$$

$$V_{out3} = V_{in3} + \frac{1}{2}V_{in3} + \frac{1}{2}V_{in4} \quad (10)$$

$$V_{out4} = V_{in1} + V_{in2} + V_{in3} + V_{in4} + \frac{1}{2}V_{in1} + \frac{1}{2}V_{in4} \quad (11)$$

Shown in FIG. 6, in the last step of the multiplication, input voltages are multiplied by the MSB of the weight matrix. The final output values are as follows:

$$V_{out1} = V_{in1} + V_{in3} + \frac{1}{2}V_{in1} + \frac{1}{2}V_{in2} + \frac{1}{2}V_{in4} + \frac{1}{4}V_{in1} + \frac{1}{4}V_{in4} \quad (12)$$

$$V_{out2} = V_{in1} + \frac{1}{2}V_{in2} + \frac{1}{4}V_{in1} + \frac{1}{4}V_{in2} + \frac{1}{4}V_{in4} \quad (13)$$

$$V_{out3} = V_{in2} + V_{in3} + V_{in4} + \frac{1}{2}V_{in3} + \frac{1}{4}V_{in3} + \frac{1}{4}V_{in4} \quad (14)$$

$$V_{out4} = \\ V_{in2} + V_{in3} + V_{in4} + \frac{1}{2}V_{in1} + \frac{1}{2}V_{in2} + \frac{1}{2}V_{in3} + \frac{1}{2}V_{in4} + \frac{1}{4}V_{in1} + \frac{1}{4}V_{in4} \quad (15)$$

The final output codes in each SAR (e.g., 307 in FIG. 3) are then inserted and charge transfer circuits (e.g., 302 in FIG. 3) are used to regenerate the analog voltages at the output (e.g., 310A-310D in FIG. 3) to be used as inputs to the next stage.

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof, solve any problems disclosed herein, and without limitation to the scope of the claims. When an embodiment of a claimed invention comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein are chosen to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described, but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

What is claimed is:

1. An analog matrix multiplier, comprising:
a plurality of successive approximation registers (SAR) operating in parallel, each successive approximation register (SAR) having an SAR digital output;
a plurality of scaling and recombining circuits for scaling and recombining each SAR's digital output, each SAR digital output resulting from quantization of a bit-wise multiplication of a digital weight matrix with an input analog voltage vector, each scaling and recombining circuit connected in series to a successive approximation register (SAR) of the plurality of successive approximation registers (SAR); and
a plurality of charge transfer circuits, each charge transfer circuit connected in series to a successive approximation register (SAR) of the plurality of successive approximation registers (SAR).

2. The analog matrix multiplier of claim 1, wherein a successive approximation register comprises:
a plurality of successive approximation register (SAR) circuits connected in parallel;
a comparator; and
a state machine.

3. The analog matrix multiplier of claim 2, wherein a successive approximation register (SAR) circuit comprises:
a first switch, a second switch, and a third switch, wherein the first switch and the second switch are complementary; and
a successive approximation register (SAR) circuit capacitor.

4. The analog matrix multiplier of claim 3, wherein the third switch is open in a sampling operation of the analog matrix multiplier and closed in a quantization operation of the analog matrix multiplier.

5. The analog matrix multiplier of claim 3, wherein:
when a bit-wise weight value is high, the first switch is closed and the second switch is open and vice versa; and
when a bit-wise weight value is low, the first switch is open and the second switch is closed.

6. The analog matrix multiplier of claim 3, wherein the successive approximation register (SAR) further comprises a successive approximation register (SAR) local memory.

7. The analog matrix multiplier of claim 6, wherein the successive approximation register (SAR) local memory is configured to store bit-wise weight values.

8. The analog matrix multiplier of claim 2, wherein the comparator compares a reference voltage Vref to an output voltage of the plurality of SAR circuits.

9. The analog matrix multiplier of claim 2, wherein an output of the comparator is an input to the state machine.

10. The analog matrix multiplier of claim 2, wherein the successive approximation register (SAR) further comprises a reset switch that is closed in a sampling operation of the analog matrix multiplier and open in a quantization operation of the analog matrix multiplier.

11. The analog matrix multiplier of claim 1, wherein a scaling and recombining circuit comprises:
a delay element;
a sampling switch;
an adder; and
a divider.

12. The analog matrix multiplier of claim 1, wherein a charge transfer circuit comprises:
an operational amplifier; and
a charge transfer circuit capacitor.

13. The analog matrix multiplier of claim 12, wherein the charge transfer circuit transfers a charge from a first stage to a second stage.

14. The analog matrix multiplier of claim 1, wherein the bit-wise multiplication of a digital weight matrix with an input analog voltage vector is performed by the successive approximation registers (SAR) using only the successive approximation register (SAR) capacitors.

* * * * *